United States Patent [19]

Doan

[11] Patent Number: 4,992,135

[45] Date of Patent: Feb. 12, 1991

[54] METHOD OF ETCHING BACK OF TUNGSTEN LAYERS ON SEMICONDUCTOR WAFERS, AND SOLUTION THEREFORE

[75] Inventor: Trung T. Doan, Boise, Id.

[73] Assignee: Micron Technology, Inc., Boise, Id.

[21] Appl. No.: 557,672

[22] Filed: Jun. 24, 1990

[51] Int. Cl.$^5$ .......................... B44C 1/22; C23F 1/00; C03C 15/00; C03C 25/06

[52] U.S. Cl. ..................................... 156/636; 156/638; 156/639; 156/645; 156/656; 156/667; 156/903; 252/79.5; 437/228; 437/245

[58] Field of Search ............... 156/636, 637, 638, 639, 156/640, 645, 656, 664, 667, 903; 437/245, 228; 252/79.5

[56] References Cited

U.S. PATENT DOCUMENTS 4,295,923 10/1981 Kasper ........................... 252/79.5 X
4,956,313 9/1990 Cote et al. ....................... 156/636 X Primary Examiner—William A. Powell
Attorney, Agent, or Firm—Wells, St. John & Roberts

[57] ABSTRACT

Disclosed is a method of etching back a tungsten layer on a semiconductor wafer by a polishing process. The method comprises:

exposing the wafer to be polished to a polishing solution at a preselected temperature, the polishing solution comprising an oxidizing component which oxidizes tungsten on the wafer to tungsten oxide;

mechanically polishing the tungsten oxide from the wafer and into the polishing solution; and the polishing solution also comprising a dissolution component selected from the group consisting of KOH and NH$_4$OH or a mixture thereof, the tungsten oxide being substantially dissoluted by the dissolution component in the solution.

21 Claims, 1 Drawing Sheet

METHOD OF ETCHING BACK OF TUNGSTEN LAYERS ON SEMICONDUCTOR WAFERS, AND SOLUTION THEREFORE

TECHNICAL FIELD

This invention relates generally to etching back of tungsten layers on semiconductor wafers.

BACKGROUND OF THE INVENTION

Integrated circuits are chemically and physically integrated into a substrate, such as a silicon wafer, by patterning regions in the substrate, and by patterning layers on the substrate. These regions and layers can be conductive, for conductor and resistor fabrication. They can also be of different conductivity types, which is essential for transistor and diode fabrication.

Deposited conductors are an integral part of every integrated circuit, and provide the role of surface wiring for conducting current. Specifically, the deposited conductors are used to wire together the various components that are formed in the surface of the wafer. Electronic devices formed within the wafer have active areas which must be contacted with conductive runners, such as metal. Typically, a layer of insulating material is applied atop the wafer and selectively masked to provide contact opening patterns. The layer is subsequently etched to provide contact openings from the upper surface of the insulating layer down into the wafer to provide electrical contact with selected active areas.

Certain metals and alloys do not provide the most desired coverage within the contact openings when applied to the surface of a wafer. This is illustrated with reference to FIG. 1. There illustrated is a diagrammatic section view of a wafer substrate 10 having a pair of contact openings 12, 14 formed therein. A metal layer 16 has been applied to substrate 10. As illustrated, layer 16 provides poor, incomplete coverage within openings 12 and 14. An example of a metal which typically provides such poor coverage is aluminum, or alloys of aluminum with silicon and/or copper.

One metal which does provide good coverage within contact vias is tungsten. FIG. 2 illustrates a layer of tungsten 18 having been applied atop wafer 10. As illustrated, complete coverage occurs within contact openings 12 and 14. Tungsten is not, however, as conductive as aluminum. Accordingly, tungsten contacts are typically etched or polished back to provide a flush upper surface layer with the upper portion of the substrate, such as is illustrated by FIG. 3. A layer of aluminum would thereafter be applied atop wafer 10 (not shown), and selectively etched to provide the desired interconnecting runs.

FIG. 4 illustrates one problem with certain etch backs of tungsten, namely an etch which is selective to the surrounding wafer but over etches within the contacts. This can provide for poor coverage within the contacts of the aluminum or aluminum alloy layer which would be applied subsequently.

A need remains for improved methods of etching back tungsten layers on semiconductor wafers.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

Disclosed is a method of etching back a tungsten layer on a semiconductor wafer by an improved polishing process, and a solution for such method. The method comprises exposing the wafer to be polished to a polishing solution at a preselected temperature. The polishing solution comprises an oxidizing component which oxidizes tungsten on the wafer to tungsten oxide. The wafer is mechanically polished to remove the tungsten oxide from the wafer and into the polishing solution. The polishing solution also comprises a dissolution component selected from the group consisting of KOH and $NH_4OH$ or a mixture thereof. The tungsten oxide removed from the wafer is substantially dissolved by the dissolution component in the solution.

The most preferred oxidizing component comprises $H_2O_2$. The KOH, $NH_4OH$, and $H_2O_2$ are nonreactive with respect to $SiO_2$ or $Si_3N_4$ on the wafer. This is typically the composition of the underlying material of the tungsten layer being etched. The $H_2O_2$ readily oxidizes the tungsten to tungsten oxide of the form $WO_3$. $WO_3$ reacts with KOH to form $K_2WO_4$ (potassium tungstate), which is readily soluble in water. $WO_3$ reacts with $NH_4OH$ to form $(NH_4)_2WO_4$ (ammonium tungstate), which is also readily soluble in water.

$H_2O_2$ is an excellent oxidizing agent. The oxidation rate of tungsten in $H_2O_2$ is controlled by reaction temperature. The higher the temperature, the higher the rate of oxidation. In the process of the invention, reaction temperature is controlled by both the mechanical polishing speed as well as the temperature of the platen within the polisher. The preferred temperature range for such polishing is from approximately 100° F. to 200° F., with 150° F. to 180° F. being most preferred.

The preferred method for conducting polishing in accordance with the invention comprises first providing the dissolution component in the form of an aqueous solution within the planarizing apparatus. A stream of a solution containing the $H_2O_2$ is fed into the planarizing apparatus at a selected rate during polishing. The mixed polishing solution is withdrawn from the planarizing apparatus during polishing at substantially the selected rate. The preferred feed and withdraw rate is from approximately 75 to 300 ml/min. The preferred feed solution is a 30 volume percent aqueous solution of $H_2O_2$. The preferred concentration of the dissolution component or compound is a 45 volume percent aqueous solution.

EXAMPLE

Figure 1:
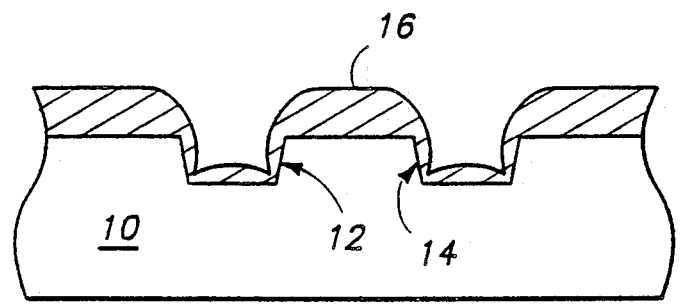
FIG. 1 is a diagrammatic section view of a semiconductor wafer, and is described in the Background section above.
Figure 2:
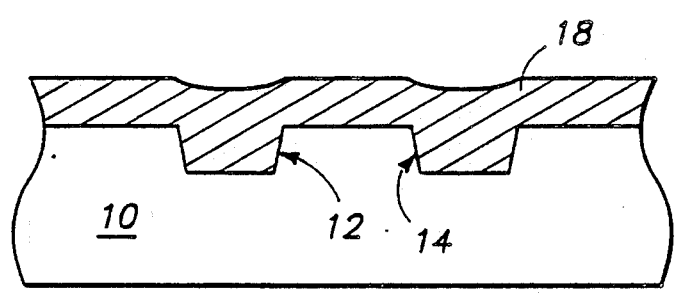
FIG. 2 is a diagrammatic section view of a semiconductor wafer, and is described in the Background section above.
Figure 3:
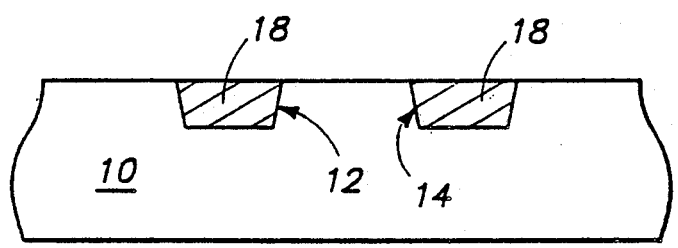
FIG. 3 is a diagrammatic section view of a semiconductor wafer, and is described in the Background section above.
Figure 4:
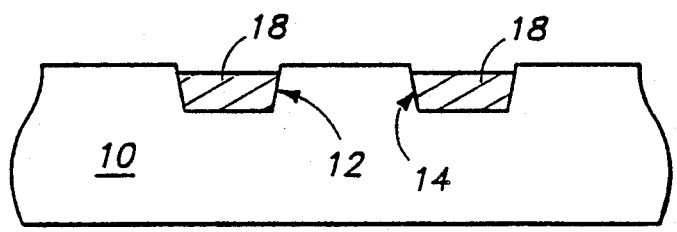
FIG. 4 is a diagrammatic section view of a semiconductor wafer, and is described in the Background section above.

A wafer having a one micron thick layer of tungsten was etched using a Westech Model No. 372 (Phoenix, Ariz.) planarizing apparatus. One liter of a 45 percent aqueous solution of KOH was placed within the Model No. 372 planarizer. During polishing, 75 ml/min. of $H_2O_2$ was fed into the planarizer, and approximately 75 ml/min. of polishing solution was removed from the planarizer during processing. The platen temperature was maintained at 150° F. The platen rotational speed was 100 rpm, with the wafer speed being 30 rpm in the opposite direction. Such chemical/mechanical polishing was conducted for two minutes to remove the tungsten layer and provide flat uniform construction, such as is shown by FIG. 3.

The above-described tungsten polishing method and solution provides for a faster and more controllable removal of a tungsten layer from a semiconductor wafer.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A method of etching back a tungsten layer on a semiconductor wafer by a polishing process, the method comprising:
    exposing the wafer to be polished to solution comprising an oxidizing component which oxidizes tungsten on the wafer to tungsten oxide;
    mechanically polishing the tungsten oxide from the wafer and into the polishing solution; and
    the polishing solution also comprising a dissolution component selected from the group consisting of KOH and $NH_4OH$ or a mixture thereof, the tungsten oxide being substantially dissoluted by the dissolution component in the solution.

2. The method of etching back a tungsten layer as defined by claim 1 wherein the preselected temperature is from approximately 100° F. to 200° F.

3. The method of etching back a tungsten layer as defined by claim 2 wherein the preselected temperature is from approximately 150° F. to 180° F.

4. The method of etching back a tungsten layer as defined by claim 1 wherein the oxidizing component comprises $H_2O_2$.

5. The method of etching back a tungsten layer as defined by claim 4 wherein the preselected temperature is from approximately 100° F. to 200° F.

6. The method of etching back a tungsten layer as defined by claim 5 wherein the preselected temperature is from approximately 150° F. to 180° F.

7. The method of etching back a tungsten layer as defined by claim 1 further comprising:
    providing an aqueous solution containing the dissolution component within a planarizing apparatus;
    feeding a stream of a solution containing the oxidizing component into the planarizing apparatus at a selected rate; and
    withdrawing polishing solution from the planarizing apparatus during polishing at substantially the selected rate.

8. The method of etching back a tungsten layer as defined by claim 7 wherein the selected rate is from approximately 75 to 300 ml/min.

9. The method of etching back a tungsten layer as defined by claim 7 wherein the oxidizing component comprises $H_2O_2$.

10. The method of etching back a tungsten layer as defined by claim 7 wherein the oxidizing component comprises $H_2O_2$, and the selected rate is from approximately 75 to 300 ml/min.

11. The method of etching back a tungsten layer as defined by claim 1 wherein the preselected temperature is from approximately 100° F. to 200° F., and the method further comprising:
    providing an aqueous solution containing the dissolution component within a planarizing apparatus;
    feeding a stream of a solution containing the oxidizing component into the planarizing apparatus at a selected rate; and
    withdrawing polishing solution from the planarizing apparatus during polishing at substantially the selected rate.

12. The method of etching back a tungsten layer as defined by claim 11 wherein the selected rate is from approximately 75 to 300 ml/min.

13. The method of etching back a tungsten layer as defined by claim 1 wherein the oxidizing component comprises $H_2O_2$, and the method further comprising:
    providing an aqueous solution containing the dissolution component within a planarizing apparatus;
    feeding a stream of a solution containing the oxidizing component into the planarizing apparatus at a selected rate; and
    withdrawing polishing solution from the planarizing apparatus during polishing at substantially the selected rate.

14. The method of etching back a tungsten layer as defined by claim 13 wherein the selected rate is from approximately 75 to 300 ml/min.

15. The method of etching back a tungsten layer as defined by claim 1 wherein,
    the oxidizing component comprises $H_2O_2$;
    the preselected temperature is from approximately 100° F. to 200° F.; and
    the method further comprising:
        providing an aqueous solution containing the dissolution component within a planarizing apparatus;
        feeding a stream of a solution containing the oxidizing component into the planarizing apparatus at a selected rate; and
        withdrawing polishing solution from the planarizing apparatus during polishing at substantially the selected rate.

16. The method of etching back a tungsten layer as defined by claim 15 wherein the selected rate is from approximately 75 to 300 ml/min.

17. A polishing solution for polishing a tungsten layer on a semiconductor wafer, the polishing solution comprising:
    an oxidizing component which will oxidize tungsten on the wafer to tungsten oxide; and
    a compound selected from the group consisting of KOH and $NH_4OH$ or a mixture thereof.

18. The polishing solution of claim 17 wherein the oxidizing component comprises $H_2O_2$.

19. The polishing solution of claim 17 wherein the compound is provided as an aqueous solution of approximately 45 volume percent.

20. The polishing solution of claim 17 wherein the oxidizing component comprises $H_2O_2$ which is provided as an aqueous solution of approximately 30 volume percent.

21. The polishing solution of claim 20 wherein the compound is provided as an aqueous solution of approximately 45 volume percent.

* * * * *

UNITED STATES PATENT AND TRADEMARK OFFICE
CERTIFICATE OF CORRECTION

PATENT NO. : 4,992,135
DATED : February 12, 1991
INVENTOR(S) : Trung T. Doan

It is certified that error appears in the above-identified patent and that said Letters Patent is hereby corrected as shown below:

On the title page, "Filed: June 24, 1990" should read -- Filed: July 24, 1990 --

Signed and Sealed this

Third Day of September, 1991

Attest:

HARRY F. MANBECK, JR.

Attesting Officer

Commissioner of Patents and Trademarks